United States Patent
Lim et al.

[19]

[11] Patent Number: 5,770,338
[45] Date of Patent: Jun. 23, 1998

[54] PHASE SHIFTING OVERLAY MARK THAT MEASURES EXPOSURE ENERGY AND FOCUS

[75] Inventors: Chang-Moon Lim, Seoul; Chang-Nam Ahn, Incheon, both of Rep. of Korea

[73] Assignee: Hyundai Electronics Industries Co., Ltd., Kyoungki-do, Rep. of Korea

[21] Appl. No.: 774,845

[22] Filed: Dec. 27, 1996

[30] Foreign Application Priority Data

Dec. 29, 1995 [KR] Rep. of Korea ............ 95-66052

[51] Int. Cl.$^6$ ............................................. G03F 9/00
[52] U.S. Cl. .................. 430/22; 257/797; 356/399; 438/975
[58] Field of Search ............ 430/5, 22; 356/399, 356/400, 401; 257/797; 438/975

[56] References Cited

U.S. PATENT DOCUMENTS

| | | | |
|---|---|---|---|
| 5,498,500 | 3/1996 | Bae | 430/22 |
| 5,538,819 | 7/1996 | De Marco et al. | 430/5 |
| 5,633,103 | 5/1997 | De Marco et al. | 430/5 |

*Primary Examiner*—Christopher G. Young
*Attorney, Agent, or Firm*—Ware, Fressola, Van Der Sluys & Adolphson LLP

[57] ABSTRACT

An overlay mark for detecting focus and exposure energy during an alignment process for forming a pattern of a semiconductor device is disclosed. The overlay mark includes an inner box and an outer box to concurrently measure exposure energy and focus, wherein, the changes of the exposure energy and the focus are respectively represented by phase shift between the inner and outer boxes in X-axis and Y-axis, the X-axis and the Y-axis representing phase shift respectively to indicate the exposure energy and the focus.

9 Claims, 2 Drawing Sheets

PHASE SHIFTING OVERLAY MARK THAT MEASURES EXPOSURE ENERGY AND FOCUS

BACKGROUND OF THE INVENTION

1. Field of the Invention

The present invention relates to a n alignment technology, and more particularly to an overlay mark which is applied to an alignment process for forming a pattern of a semiconductor device.

2. Description of the Related Art

To accurately transfer a mask pattern onto a photosensitive film coated on a layer to be patterned, there are two major process requirements of exposure energy and exposure focus.

As a conventional method for measuring the exposure energy from the photosensitive film which is exposed to light, a method for directly measuring a photosensitive film pattern using equipment such as a critical dimension-scanning electron microscope (CD-SEN) has been used. In addition, a method for observing change of a pattern according to focus using equipment such as the CD-SE. or an optical microscope has been employed as the method for measuring the focus.

However, the above method s are time-consuming when measuring the exposure energy or the focus and have a difficulty in measuring many places in a wafer or in a field, since the methods directly monitor objective patterns to obtain accurate exposure energy and accurate focus.

SUMMARY OF THE INVENTION

To overcome the above problems, it is an object of the present invention to provide an overlay mark for monitoring exposure energy and focus by which the change of the focus and the exposure energy can be measured within a relatively short time.

Accordingly, to achieve the above object, there is provided an overlay mark including an inner box and an outer box to concurrently measure exposure energy and focus, wherein the changes of the exposure energy and the focus are respectively represented by phase shift between the inner and outer boxes along the X-axis and Y-axis, the X-axis and the Y-axis representing phase shift to indicate the exposure energy and focus, respectively.

BRIEF DESCRIPTION OF THE DRAWINGS

Further objects and advantages of the present invention will be apparent from the following description with reference being to the accompanying drawings wherein preferred embodiments of the present invention are clearly shown.

In the drawings.

DETAILED DESCRIPTION OF THE PREFERRED EMBODIMENT

Figure 1:
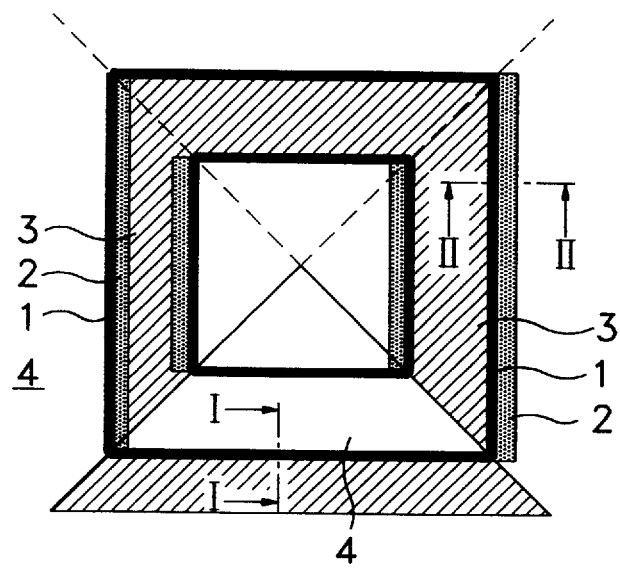
FIG. 1 is a plan view showing a mask provided with an overlay mask to concurrently measure exposure energy and focus according to the present invention.

Referring to FIG. 1, an overlay mark having inner and outer boxes is located at a predetermined area on a mask, the boxes being of a relatively thin strip shape. According to a position in relation to the inner and outer boxes, a light shield pattern 1, a semi-transparent pattern 2 having a 40% transparency, a 90° phase shift area 3, and a light transparent area 4 are provided at selected positions. The light shield area 1 is generally made of chromium, and the 90° phase shift area 3 and the light transparent area 4 are made of a quartz substrate.

To concurrently measure the exposure energy and focus, the left and right sides of the inner and outer boxes of the overlay mark are respectively arrayed asymmetrically. In the overlay mark as shown in FIG. 1, the light transparent area 4, the light shield pattern 1, the semi-transparent pattern 2 and the 90° phase shift area 3 are sequentially arrayed from the left to the right at the left side of the outer box, and the 90° phase shift area 3, the light shield pattern 1 and the semi-transparent pattern 2 are sequentially arrayed from the left to the right at the right side of the outer box.

In addition, the 90° phase shift area 3, the semi-transparent pattern 2, the light shield pattern 1 and the light transparent area 4 are sequentially arrayed from the left to the right at the left side of the inner box, and the light transparent area 4, the semi-transparent pattern 2, the light shield pattern 1 and the semi-transparent pattern 2 are sequentially arrayed from the left to the right at the right side of the inner box.

Also, shown in FIG. 1, in case that the inner and outer boxes of the mask are diagonally sectioned, the phase shift area 3 is provided at the lower portion of the inside of the inner box. The light transparent area 4 is provided at the lower portion existing between the inner and outer boxes, and the 90° phase shift area 3 is provided at the lower portion to the outside of the outer box.

Figure 2A:
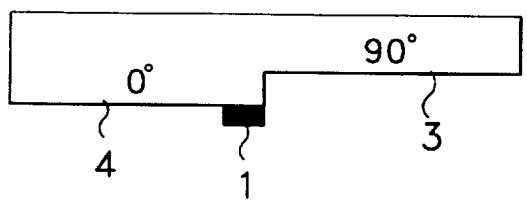
FIGS. 2A and 2B are a diagram and a graph for showing the principle wherein the change of the focus is represented by the movement of a pattern.
Figure 2B:
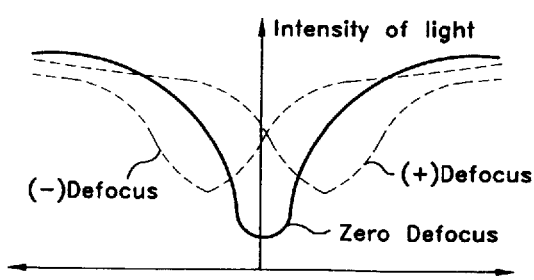

FIG. 2A is a sectional view taken along the line I—I, and FIG. 2B shows an aerial image indicating the distribution of light intensity formed on a focal plane by a mask when a process of exposing a positive photosensitive film is performed using the mask of FIG. 2A.

Referring to FIG. 2A, the quartz substrate has one side where phase does not change and the other side where the phase changes by 90° and a chromium pattern 1 is formed at the bottom surface of either the light transparent area 4 or phase shift area 3, at the edge where the two areas meet.

In the graph of FIG. 2B, a solid line indicates zero defocus and a dotted line indicates (+) and (−) defocuses. The zero focus occurs when a focal plane of light emitted to the photosensitive film from a projection lens is positioned at the same plane of the photosensitive film. The (+) defocus occurs when the photosensitive film for forming a pattern is positioned above the focal plane of light and the (−) defocus occurs when the photosensitive film for forming a pattern is positioned under the focal plane of light.

In the case of the zero defocus, while intensity of light appears strong under the light transparent areas 3 and 4 where the light passes through at approximately a 100% transmission rate of the light's exposure energy (or 100% light transparency), the light passes through the light shield pattern 1 and a predetermined region of the 90° phase shift area adjacent to the light shield pattern 1, at a transmission rate of nearly 0%. In the case of the (+) and (−) defocuses, a position where the light intensity is minimum is deviated to the right or the left from the position of zero defocus.

Figure 3A:
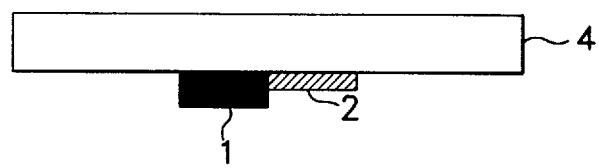
FIGS. 3A and 3B are a diagram and a graph for showing the principle wherein the change of the exposure energy is measured by the movement deviation of the overlay mark.
Figure 3B:
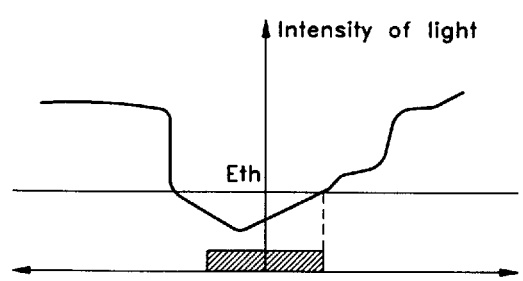

FIG. 3A is a sectional view taken along the line II—II and FIG. 3B shows an aerial image resulting from the pattern of FIG. 3A.

Referring to FIG. 3A, a narrow line of the semi-transparent pattern 2 having a 40% light transparency is disposed next to the narrow light shield pattern 1 that is positioned below the bottom of the quartz substrate. When a pattern to be formed through a lithography process is a line or a space pattern, the exposure energy of photosensitiver film should be 2–3 times greater than a threshold energy Eth. Here, the Eth is the minimum optical energy required for the total removal of the photosensitive film by a developing solution.

In consideration of the above, the 40% energy transmitted through the semi-transparent pattern 2 is a value around the Eth, with which the photosensitiver film can be totally removed or not in a developing process. In other words, since a minor change of the exposure energy at around that portion can affect directly on a photoresist film pattern size, the semi-transparent pattern provided to the overlay mark of the present invention is the basis of detecting a minor change of the exposure energy.

Although the phase shift applied to the above embodiment is 90°, the phase shift area can be substituted for an area having a phase shift of 45–135°. Also, a semi-transparent pattern having a 30–50% light transparency can be used as the semi-transparent pattern, and positive and negative photosensitive films can be used as the photosensitiver films to be exposed by the exposure mask. As exposure equipment using the exposure mask, equipment with either of G-line, I-line or deep ultra violet (DUV) wavelength can be used.

Referring to FIG. 1 again, the overlay mark is to measure the change of the exposure energy in X-axis and the change of the focus in Y-axis, respectively. When a photosensitive layer is exposed to a light through a mask with the overlay mark of FIG. 1, an overlay mark is formed at a selected position of the photosensitive layer through transfer of the overlay pattern from the overlay mark of the mask onto the photosensitive layer. The overlay mark formed on the photosensitive layer is same with the overlay mark on the mask only when zero focus is performed and a selected exposure energy is proper, while it has a different shape when defocus is performed and/or improper exposure energy is selected.

In view of X-axis, width of the outer bar of the outer box and width of the inner bar of the inner box at the left side of the formed overlay mark is respectively reduced while the exposure energy increases. As a result, the distance between the bars becomes wider. This result occurs because a portion of the photosensitive layer placed below the semi-transparent area 2 is exposed due to the increase in the exposure energy. In view of the Y-axis, as the focus moves to (+) side, a distance between the outer and inner bars at the upper portion is reduced. In other words, the bars moves to the 90° phase shift area, while a distance between the outer and inner bars at the lower portion increases under the same conditions. As a result, the center is moved downward.

Consequently, by measuring the overlay offset of FIG. 1, the change of the exposure energy and the change of the focus can be measured from the data from the X-axis and Y-axis, respectively.

According to another embodiment, since critical dimension(CD) and the overlay data from the overlay mark are corrected in wafers processed in plurality, an outgoing inspection to the remaining wafers can be replaced with a simple overlay measurement. Further, the overlay mark can be employed in measuring illumination uniformity and focus uniformity of exposure equipment.

As described above, according to the present invention, whether process factors such as exposure energy and focus can be easily measured, they are applied uniformly in plurality and in a wafer or a field in a semiconductor lithography process. Therefore, reliability in a process is improved as well as increased productivity and efficiency of the exposure equipment.

While the present invention has been particularly shown and described with reference to particular embodiment thereof, the present invention is not defined to the above-described embodiment. Moreover, it will be understood by those skilled in the art that various changes in form and detail may be effected therein without departing from the spirit and scope of the invention as defined by the appended claims.

What is claimed is:

1. An overlay mark comprising an inner box and an outer box to concurrently measure exposure energy and focus, wherein the changes of exposure energy and focus are respectively represented by phase shift between said inner and outer boxes in X-axis and Y-axis, and the X-axis and the Y-axis representing phase shift respectively indicate the exposure energy and the focus.

2. The overlay mark as claimed in claim 1, wherein said inner and said outer boxes of said overlay mark are in of an asymmetric structure with respect to the X-axis and the Y-axis.

3. The overlay mark as claimed in claim 1, comprising, along its X-axis:

a light shield area, a semi-transparent area and a phase shift area in said outer box, and a light shield area in said inner box are sequentially arrayed from the left side to the center thereof;

a light transparent area having no phase shift, a semi-transparent area, the light shield area and a phase shift area in said inner box, the light shield area and the semi-transparent area in said outer box are sequentially arrayed from the center to the right side thereof;

a phase shift area is located at the lower portion inside said inner box in a state where said outer and inner boxes are quartered diagonally;

a light transparent area is located at the lower portion between said inner and outer boxes; and a phase shift area is located at the lower portion of said outer box.

4. The overlay mark as claimed in claim 3, wherein phase shift range of said phase shift area is 45°–135°.

5. The overlay mark as claimed in claim 4, wherein phase shift range of said phase shift area is 90°.

6. The overlay mark as claimed in claim 3, wherein light transparency of said semi-transparent area is 30–50%.

7. The overlay mark as claimed in claim 6, wherein light transparency of said semi-transparent area is 40%.

8. The overlay mark as claimed in claim 1, wherein a photosensitive film where said overlay mark is to be is either positive or negative.

9. The overlay mark as claimed in claim 1, wherein light to be emitted to form said overlay mark is selected from beams having a wavelength of G-line, I-line and deep ultra violet (DUV)-line.

* * * * *

UNITED STATES PATENT AND TRADEMARK OFFICE
CERTIFICATE OF CORRECTION

PATENT NO. : 5,770,338
DATED : June 23, 1998
INVENTOR(S) : Lim et al.

It is certified that error appears in the above-identified patent and that said Letters Patent is hereby corrected as shown below:

Column 1, line 8 "a n alignment" should read --an alignment--.

Column 1, line 21 "microscope (CD-SEN)" should read --microscope (CD-SEM)--.

Column 1, line 23 "the SE" should read --the SEM--.

Column 1, line 26 "above method s" should read --above methods--.

Signed and Sealed this

Twenty-ninth Day of September, 1998

Attest:

BRUCE LEHMAN

*Attesting Officer*  *Commissioner of Patents and Trademarks*